United States Patent [19]
Grasty

[11] Patent Number: 5,307,228
[45] Date of Patent: Apr. 26, 1994

[54] MAGNETIC FIELD DAMAGE INDICATOR

[76] Inventor: James S. Grasty, 3941 "B" Bristol St., #442, Santa Ana, Calif. 92704

[21] Appl. No.: 93,454

[22] Filed: Jul. 19, 1993

Related U.S. Application Data

[63] Continuation of Ser. No. 802,343, Dec. 4, 1991, abandoned.

[51] Int. Cl.$^5$ .............................................. H01F 10/02
[52] U.S. Cl. ................................... 360/132; 360/133; 360/134; 360/135; 427/128; 428/900; 428/694 R
[58] Field of Search ................. 427/128; 428/694, 900; 360/133, 134, 135, 132

[56] References Cited

U.S. PATENT DOCUMENTS 4,283,438 8/1981 Lee .......................................... 427/47

Primary Examiner—Bernard Pianalto
Attorney, Agent, or Firm—Knobbe, Martens Olson & Bear

[57] ABSTRACT

A magnetic field indicator is provided which visually indicates the presence of a potentially harmful magnetic field by means of a magnetically responsive additive. In one embodiment, the additive comprises ferrite-encapsulating microspheres which contain ferrite flakes. The ferrite flakes are movably suspended within the microspheres so that the flakes are free to align with the lines of flux of a magnetic field. In the presence of a magnetic field, the ferrite flakes align themselves with the lines of flux of the magnetic field, thereby changing the reflectivity and other visual characteristics of the material which incorporates the ferrite flakes, so that an observer is able to visually detect the presence of a magnetic field. The magnetic field indicator may be embodied in accordance with a variety of applications. These embodiments include a coating, a solid, a gel, and a cloth, each of which may be affixed to, or incorporated within, the housing of a magnetic storage device, so that a visual indication of the presence of a potentially damaging magnetic field is provided. In a preferred embodiment of the invention, a pattern is magnetically written on the surface of a material which incorporates the magnetically responsive additive. This pattern provides a higher contrast between the activated state (that state in which a magnetic field is detected) and the unactivated state of the magnetic field indicator device. The present invention may also be employed as a display means for electro-magnetically controlling visual displays, polarizing windows, and shutters.

10 Claims, 7 Drawing Sheets

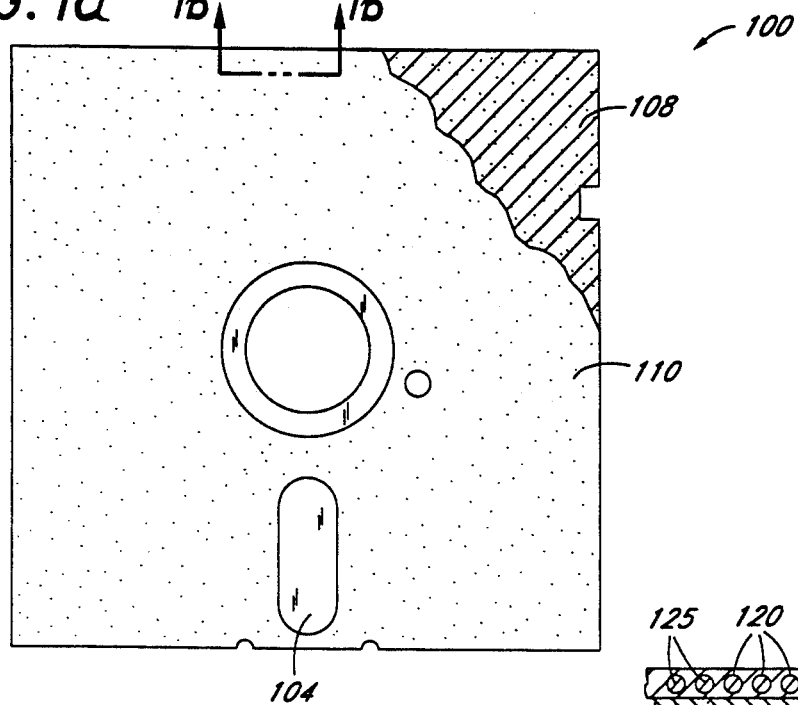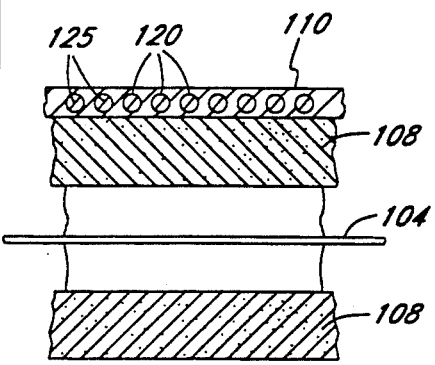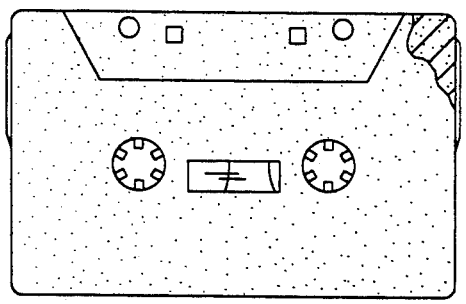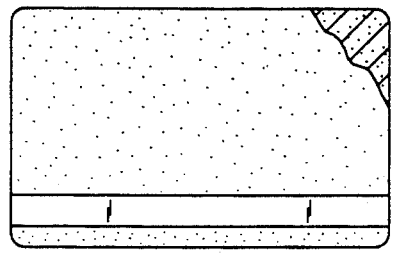

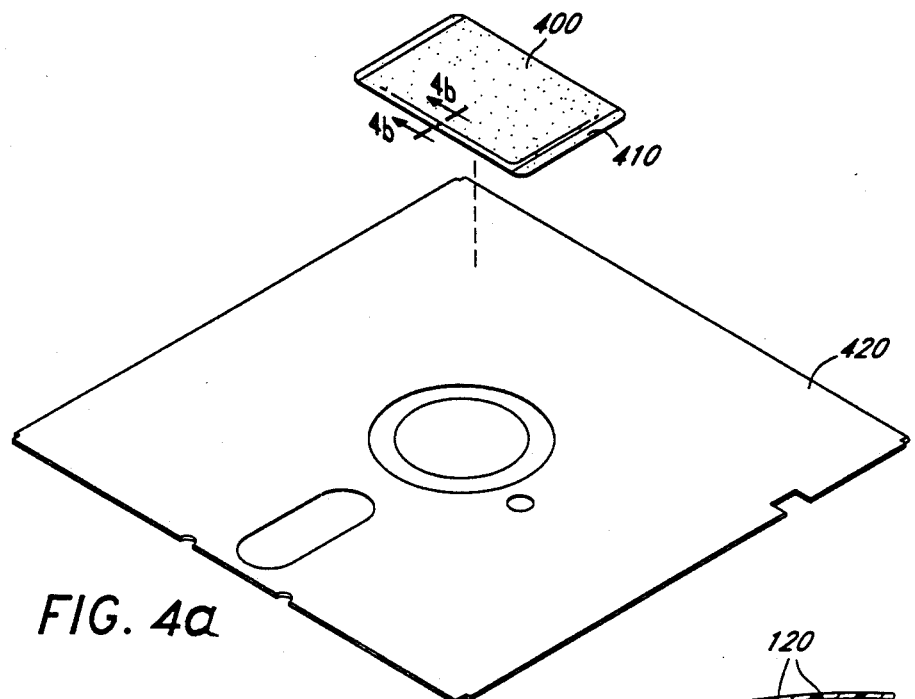
FIG. 4a
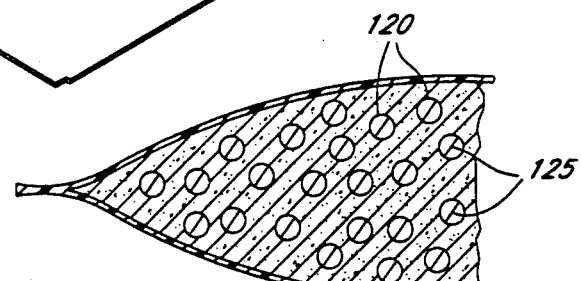
FIG. 4b
FIG. 5a
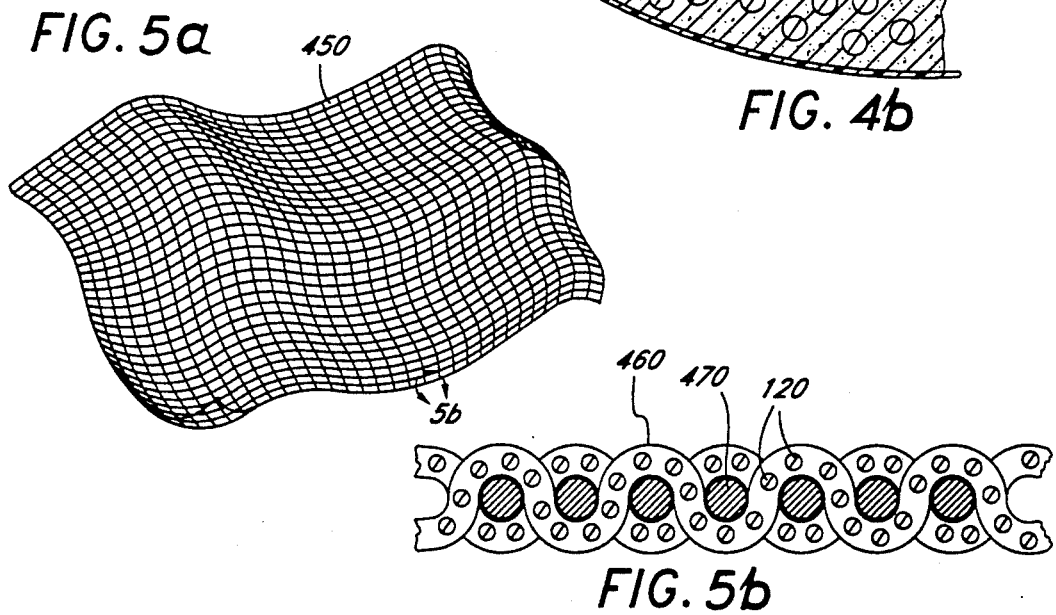
FIG. 5b

MAGNETIC FIELD DAMAGE INDICATOR

This application is a continuation of application Ser. No. 07/802,343, filed Dec. 4,1991, abandoned.

BACKGROUND OF THE INVENTION

1. Field of the Invention

The present invention relates to a magnetic field indicator which detects the possibility of damage to data stored on magnetic recording media, and, more particularly, to a visual magnetic field indicator which can be constructed in a variety of forms and embodiments in order to provide close proximity and conformity to the recording media being protected.

2. Description of the Related Art

Magnetic recording media is ubiquitous in our present society. Examples of such media include computer disks and tapes, audio and video cassette tapes, and magnetic strips utilized on a wide variety of cards and other objects, such as credit cards, security pass cards, and the like. Obviously, the data stored on this wide variety of media is extremely valuable. The loss of some or all of this data could lead to a severe loss of time and money, in addition to a great deal of personal frustration.

Data stored on magnetic recording media may be destroyed, in whole or in part, or corrupted, when impinged upon by an external magnetic field. For example, during transportation or in regular use, valuable information contained on magnetic recording medium may be lost due to magnetic fields generated from a variety of sources. Such sources include music speakers, refrigerator magnets, or other magnetized objects.

Software vendors, computer users, automatic teller machine and credit card companies and users, recording artists, and others have a substantial investment in their recorded information. However, heretofore there has not been an adequate mechanism for economically protecting such data for a wide variety of users.

Devices have been developed which are capable of sensing the presence of harmful magnetic fields that can damage data on recording media; however, they have been found to suffer from a number of shortcomings. For example, one type of device comprises a magnetic field alarm indicator which includes a complicated arrangement of electronic devices. Another device utilizes an antenna to focus magnetic energy at a point detector. Although it is possible that these systems may be useful in applications dealing with large computer installations, systems of this sort are prohibitively expensive for the average computer user and would typically be useless for protecting data on cassette tapes, credit cards and the like. Other attempts to provide a magnetic field indicator have yielded devices which exhibit unacceptable levels of sensitivity because they could not be positioned with sufficient proximity to the data to be protected.

Presently, the technology is available to produce substances which contain ferrite-encapsulating microspheres. These substances are capable of providing a visual indication of the presence of a magnetic field. For example, U.S. Pat. Nos. 4,783,336 and 4,929,400 disclose methods for producing microspheres. However, heretofore such materials have generally been employed in biological areas, or for the purposes of amusement in such devices as magnetic scratch pads.

Thus, there is a need for a magnetic field damage indicator which is inexpensive and can be positioned with proximity to the data to be protected in order to provide sufficient sensitivity.

SUMMARY OF THE INVENTION

The magnetic field indicator of the present invention provides an inexpensive yet reliable means for detecting the presence of a potentially damaging magnetic field. The subject invention provides an immediate visual magnetic field detection system which can be implemented within the recording media itself, thereby providing maximum proximity and sensitivity. Thus, regardless of the type of media, the present magnetic field detection system can accomplish its intended purpose in a simple and cost effective manner.

The visual indicator of the present invention is light reactive. That is, in its non-activated mode, before any magnetic field has been detected, the present indicator will provide a pre-selected visual response to the impingement of light thereon. Upon activation (i.e., the detection of a magnetic field of sufficient strength to be recorded), the indicator will provide a different visual response to light. In one embodiment, for example, the indicator may be light transmissive in the non-activated state, while in the activated state, the indicator will reflect light. Thus, the difference in the visual appearance of the indicator signifies the detection of a magnetic field. Of course, the indicator could also be implemented to reflect light when it is not activated, and pass light when it is activated in order to provide the indication function of the present invention.

An important advantage of the present invention is that the sensitivity of the indicator is not dependent on the intensity of the impinging light, but rather on the strength of the magnetic field. The reaction of the indicator to the impingement of light thereon merely indicates the presence of a magnetic field of sufficient strength. Thus, the light response can be varied in a number of ways to achieve the desired state. For example, the indicator may be implemented so that, in response to the detection or change of a magnetic field, the indicator provides a visual reaction which contrasts between dark and light. In another embodiment, a visual response which employs fluorescent colors can be provided to indicate the detection of a magnetic field. Furthermore, the present indicator does not require external power, other than natural or artificial light. Moreover, if the indicator is "tripped" (i.e., a field of sufficient strength is detected), the indicator can be reset to its initial non-activated state and reused after the data is restored. Even the reusability feature of the present invention can be provided inexpensively and easily to the media owner.

Another advantage of the present indicator is that it can be constructed to make visual identification of the activated state easier, while at the same time providing a more sensitive device. For example, in one embodiment of the present invention, in its non-activated state, the indicator will provide a uniform visual appearance. In this embodiment, the presence of a magnetic field will be indicated by random markings on the indicator surface. However, in another embodiment of the present invention, the visual appearance of the indicator may be non-uniform in order to provide a contrast between the activated state and the non-activated state. For example, stripes or wavy lines can be formed on the indicator while in its non-activated state. Due to the striking visual contrast between the regular pattern and the random markings, the random markings created on the indicator by the presence of the magnetic field will be even more pronounced and noticeable. Thus, the device is inherently more sensitive because the visual indication of the magnetic field is easier to detect. This advantage of the present invention obviates the need for alarms or other obtrusive reaction means.

Thus, the present magnetic field damage indicator provides a means of use which is easily comprehended by the average user. Furthermore, the indicator provides a visual indication of the impingement of a magnetic field which is retained for later observation. In this regard, the indicator can be reset for subsequent use and the damaged or corrupted data may then be restored. This reusable feature provides an important advantage of the present invention, in part since the resetting mechanism provides a visual indication on the present indicator which is easily distinguished from a random field which may damage data. Moreover, the present indicator can be constructed in a variety of ways to change the optical qualities of the detection, such as color, reflectivity, transmissivity, and absorptions, depending upon the use and application.

Besides visual sensitivity, the present device can also be constructed so as to internally vary according to the desired sensitivity. It has been found that a magnetic field of one strength may damage data on one type of media but not on another. Thus, it may be desirable in certain applications to have a magnetic field indicator which provides variable detection levels in accordance with the sensitivity of the media to be protected. In other words, the indicator would be adapted to have varying sensitivities depending on its application and the point at which the media to be protected could experience damaged or corrupted data. For example, an individual indicator can be made more sensitive in areas proximate to sensitive magnetic media, while being made less sensitive in areas proximate to less sensitive magnetic media. Thus, the present invention can easily account for the variations in harmful magnetic fields. Even within a single indicator, sensitivity can be varied along a scale or gradient to provide a measurement mechanism for the strength of the field. That is, the indicator can actually provide a visual appearance analogous to a bar graph depending upon the strength of the detected field because the indicator is made so that it provides a visual response which is more sensitive to the magnetic field at one location than at another.

Another important advantage of the present invention is that various embodiments of the indicator can be constructed in accordance with a particular application. In a preferred embodiment, an indicator constructed in accordance with the present invention conforms to the media housing surrounding the data to be protected, thus providing close proximity and sensitivity. As is well known, magnetic flux forms a field which has varying strengths at different points within the field. Thus, it is an advantage to know the strength of the field immediately adjacent the media and not somewhere else. The present invention supplies this advantage because it is capable of being implemented in a variety of embodiments.

For example, the indicator of the present invention can take the form of a sheet stock or paperback material. Thus, the indicator can take the form of a label, including one which is provided with printed or screen printed information. The label can then easily be applied to a number of magnetic recording media, such as floppy disks, cassettes, credit cards, and the like. Further, the present indicator can be embodied in the form of a paint or coating which can be applied to a number of recording media products. Moreover, the present indicator can be embodied in a fiber which can be woven into a cloth. The indicator can also be molded into a solid form and physically embodied in the media housing, or produced in the form of a gel which is sealed within a liquid-proof package. Thus, the present indicator can virtually conform to an indefinite number of magnetic data storage media types. In this context, the present indicator provides maximum proximity to the media to be protected, while providing maximum sensitivity to any detectable magnetic fields.

Thus, the present magnetic field indicator is readily transportable and can be applied in intimate proximity to the existing magnetic recording media, its packaging, and enclosures. The indicator can be applied to the media as a retrofit or accessory product, or can be embodied internally into the construction of the housing or packaging of the media. Moreover, the indicator is suitable for high volume, low cost production for the consumer market.

In one embodiment, the present indicator is constructed from the arrangement of a number of microspheres which encapsulate minute particles or flakes of a ferromagnetic or paramagnetic material. The particles are movably suspended within the microsphere so that they can respond to the presence of a magnetic field. Thus, the orientation of the field-responsive particles will vary depending upon the presence of a field of sufficient strength. In the present invention, a number of the microspheres are arranged in a suitable binding material so that the particles within are oriented in a uniform fashion. In the non-activated state, the particles will, in response to light, provide a particular preselected visual indication. In the activated state, the particles will provide a different visual indication, thus indicating the presence of a magnetic field.

For example, if the particle encapsulated within the microsphere takes the form of a flat ferromagnetic flake oriented, in a non-activated state, to be parallel to direction of the impinging light, the indicator will be transmissive with respect to said light. However, upon the detection of a magnetic field, the flakes are reoriented as a result of the magnetic field to be perpendicular to the light. Thus, a light reflective indication of the magnetic field is provided. Of course, this orientation can be reversed, while still accomplishing the field detection purposes of the present invention. Moreover, as noted above, a number of combinations and variations can be made in order to affect the visual indication provided by the present invention, such as color, reflectivity, transmissivity, and absorptions, in order to achieve various optical characteristics.

In order to provide an enhanced visual indication, the indicator can be constructed, in its non-activated state, to provide a light responsive contrast. For example, again by the use of an intentionally applied alternating magnetic field, stripes or lines can be formed on the indicator. Thus, the visual indication of a random, damaging magnetic field will be more readily apparent.

Furthermore, through the microspheric construction of the present indicator, its sensitivity can be varied widely by modifying the viscosity of the suspension material. Preferably, such suspension material takes the form of a polymer or glass which provides a microspheric "molecule." The construction of microspheres is well known. Thus, the microspheres may be comprised of an organic (e.g., polymeric suspension) or inorganic (e.g., glass) suspension which is created from an emulsion of particles, viscous fluid droplets of the suspension material, and a binding material to hold the microspheres together, as well as an appropriate surfactant which serves to form the microspheres. It should be pointed out, however, that a number of magnetic responsive materials can be utilized to provide the movable, suspended particle encapsulated within the microspheres. Likewise, a number of suspension materials and binding materials may be used to construct the indicator of the present invention.

As a result of the minute microspheric construction of the present invention, the indicator can take on a variety of forms. When applied to a substrate, the indicator may take the form of a sheet stock or label. Likewise, as described above, the microspheres can be embodied in a paint and applied to the surface of a number of types of magnetic recording media. Likewise, the microspheres can be embodied in a thread in order to form a magnetic field indicator cloth, and incorporated into a material which can be formed into a solid by means of, for example, injection molding. Thus, there is virtually no limit to the forms in which the present indicator may take.

Furthermore, it can be seen that, through the microspheric construction described above, the indication of the magnetic field will be retained for later observation by the user. Moreover, the indicator can be restored to its original, non-activated state by means of a magnetic field intentionally applied to the indicator by the user. Thereafter, the media as well as its associated indicator is reusable.

Other applications for the present indicator are within the scope of the present invention. For example, in combination with a fine wire conductor or a transparent conductor matrix pattern such as indium tin oxide printed on glass to create an electromagnetic field matrix, the creation of displays, signs, polarizing windows, and electronic shutters is possible In a similar embodiment, by the use of a magnetically tipped piece or pin, an electronic input device is possible. Moreover, the present indicator may also serve as a display mechanism in order to output certain data by means of a magnetic field. For example, by use of an appropriate magnetic field, the present indicator can serve to read out certain information such as an account balance, etc. Furthermore, a magnetic recording media read/write mechanism, such as a floppy disk drive, may include a reflected light sensor which automatically scans a portion of the present indicator in order to detect the activated state of the indicator. This avoids the need for the user to visually note the activated state on the indicator. For example, the indicator may comprise a label which has a visible bar code pattern formed thereon. The light sensor on the disk drive could scan the bar code to determine if the magnetic field indicator label is in the unactivated or the activated state. If the label has been activated, so that the bar code is no longer decodable, this indicates to the disk drive that the data on the magnetic media could be corrupt. Thus, the operation of the disk drive could be suspended and a message transmitted to the user on the CRT display screen. This avoids the possible danger of damaged or corrupted data being added to the database being utilized.

BRIEF DESCRIPTION OF THE DRAWINGS

FIG. 1a is a perspective view which shows an application of the present invention wherein the magnetic field warning indicator is embodied as a paint or coating which is applied so that it conforms to the surface of a floppy magnetic storage disk.

FIG. 1b is a cross-sectional view of the floppy disk of FIG. 1a along the line 1b—1b.

FIGS. 1c and 1d are perspective views wherein the magnetic field indicator is applied as a paint to the surface of the housings of a magnetic storage tape cassette (FIG. 1c) and a credit card having a magnetic strip (FIG. 1d).

FIG. 3b is an enlarged cutaway view of a portion of the housing shown in FIG. 3a.

FIG. 4a is a perspective view which shows the magnetic field indicator as produced in the form of a gel which is sealed within a liquid-proof package.

FIG. 4b is an enlarged view showing the microspheres as incorporated within the gel of FIG. 4a.

FIG. 5a shows an embodiment of the invention wherein the magnetic field indicator is embodied as a fiber which can be woven into a cloth.

FIG. 5b is an enlarged cross-sectional view of the cloth shown in FIG. 5a.

FIGS. 9a, 9b and 9c illustrate an embodiment of the invention wherein a matrix pattern is formed by etched micro-coils on the surface of the magnetic field indicator to allow for the creation of displays, electronic shutters, and the like.

FIGS. 9d and 9e illustrate an embodiment of the invention wherein a conductor matrix pattern is formed by etched traces which form a grid pattern on the surface of the magnetic field indicator to allow for the creation of displays, electronic shutters, and the like.

FIG. 9f is a schematic view showing a sub-miniaturized chip, which is capable of producing a magnetic field, and which may be bonded to the surface of a magnetic field indicator in an ordered pattern to allow for the creation of displays, electronic shutters, and the like.

DETAILED DESCRIPTION OF THE PREFERRED EMBODIMENTS

Figure 2:
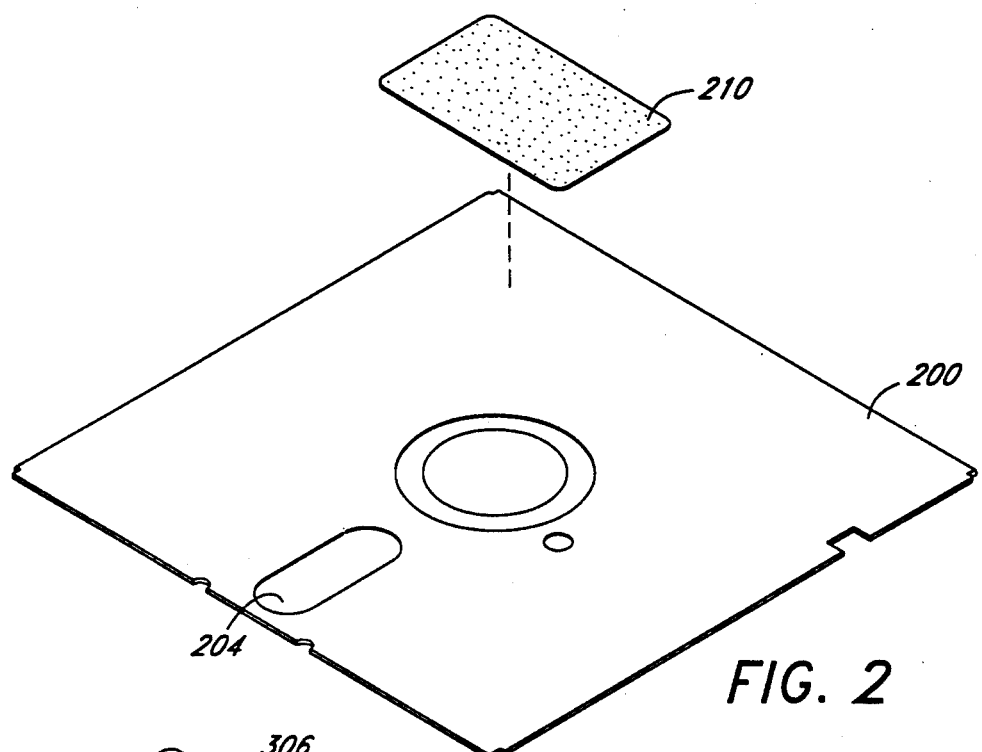
FIG. 2 is a perspective assembly view of the magnetic field warning indicator of the present invention as embodied in a sheet stock or paperback label which may be affixed to the surface of the media housing such as a floppy disk.

FIGS. 1-5 show the magnetic field indicator of the present invention as embodied in accordance with various applications of the invention. FIGS. 1a-1d show one application of the invention wherein the magnetic field indicator is embodied as a coating or paint which is applied directly to the surface of the housing of a magnetic media. The coating may be applied to the surface of a variety of different magnetic storage devices such as a floppy disk 100 (FIG. 1a), a cassette tape 150 (FIG. 1c), and a credit card 160 (FIG. 1d). This application of the invention will be described with reference to the floppy disk 100 only, however, it will be clear to one skilled in the art that the teachings of the immediately following description can be applied to any number of magnetic storage devices.

FIG. 1a is a perspective view of the floppy disk 100 including a magnetic media 104 enclosed within a housing 108. The housing 108 is coated with a thin layer of magnetic field indicator (MFI) paint 110, and a portion of the housing 108 is shown in breakaway. FIG. 1b is an enlarged cross-sectional view of a section of the floppy disc 100 which shows a plurality of ferrite-encapsulating microspheres 120 bound within the paint 110 (it should be noted that the thickness of the layer of paint 110 and the size of the microspheres 120 have been exaggerated to more clearly show the microspheres 120). Each of the microspheres 120 encapsulate a ferrite flake 125 which is movably suspended in a fluid, such as oil, within the microsphere 120. The microspheres 120 are known in the art, and this material may be obtained from numerous manufacturers. Also shown in the cross-section of FIG. 1b are the housing 108, and the magnetic media 104.

The paint 110 may be produced in at least two manners similar to the production of conventional paint. In one method, an organic substance is employed to produce the paint 110. In this method, the ferrite flakes 125 are mixed into a binding element with a surfactant. The surfactant is attracted to the ferrite flakes 125 so that the surfactant forms a spherical barrier which encapsulates the ferrite flakes 125 and the binding media in the immediate vicinity of the flakes 125. The entire mixture is then cured, so that the binding media on the outside of the microspheres 120 is cured, while the binding media within the microspheres 120 is protected by the barrier so that the binding media within the spheres remains in a liquid form. Thus, the internal binding media movably suspends the ferrite flakes 125 within the microspheres 120. It should be noted that, in this method, the viscosity of the binding media may be altered in order to provide a desired resistance to the rotation of the ferrite flakes 125 within the microspheres 120. In an alternative manufacturing method, a sufficient quantity of preformed microspheres 120 is added to the paint solution during the production process. These preformed microspheres 120 preferably have an inert outer surface, which is made of a material such as glass, so that the microspheres 120 are not likely to react with the paint solution. Conventional paint solutions include a mixing base (e.g., water, oil, etc.), and an adhesive or binding material (e.g., acrylic, vinyl, silicon, etc.). Many paints also include coloring pigment so that, by selecting different types of pigment, the paint solution may be modified to assume different colors.

The MFI paint 110 of the present invention may or may not include pigment depending upon the specific application. Of particular consideration is the contrast which is achieved between the activated state (i.e., when a magnetic field is detected) and the unactivated state (i.e., when a magnetic field is not detected) of the MFI paint 110.

It is generally desirable to provide a high contrast between the activated and the unactivated states so that the difference between the two states is visibly obvious. In one embodiment, for example, a high contrast may be achieved by including a fluorescent pigment within the MFI paint 110 which becomes particularly visible only in the activated state. In another embodiment, the MFI paint 110 does not contain pigment, but includes a transparent binding material which suspends the microspheres 120, so that, when light is allowed to pass through the MFI paint layer 110, the housing 108, or some other reflective/absorptive backing, is visible.

When the floppy disk 100 coated with the MFI paint 110 is introduced into a magnetic field, the ferrite flakes 125 within the microspheres 120 align themselves with the lines of flux of the magnetic field. Because of the predictable light reactive qualities of the ferrite flakes 125, in association with the light reactive qualities of the backing, this causes a visible change to occur in the appearance of the surface of the floppy disk 100. In one application, the disk 100 is coated with one or more layers of the paint 110, and is then exposed to a high intensity magnetic field prior to the storage of any data on the disk 100. This high intensity magnetic field is sufficient to overcome any resistance due to the viscosity of the suspension material within the microspheres 120, so that the ferrite flakes 125 are caused to align with the lines of flux of the impinging magnetic field. Thus, the ferrite flakes 125 assume a configuration which is determined by the pattern of the lines of flux of the high intensity magnetic field. Once the flakes 125 have been aligned, the viscosity of the suspension material causes the flakes 125 to retain their positions until a magnetic field of sufficient intensity causes the ferrite flakes to realign. The configurations assumed by the ferrite flakes 125 may comprise an indefinite number of patterns or symbols. In one embodiment, for example, the pattern formed on the surface of the MFI paint 110 may consist of straight or wavy lines of alternating light and dark to provide a sharp visible contrast. In another embodiment, the pattern formed on the MFI paint 110 may consist of alternating colors or the like. In certain special applications of the invention, it is possible to impart a magnetic predisposition to the ferrite flakes 125 so that the flakes 125 have a preferred orientation. It has been found that the exposure of the microspheres 120 to a high intensity magnetic field results in a permanent magnetization of the ferrite flakes 125 encapsulated within the microspheres 120. The high intensity magnetic field therefore imparts a magnetic "predisposition" to the ferrite. This magnetic predisposition causes the flakes to assume a configuration which is aligned with the lines of flux of the high intensity magnetic field more easily than other configurations. The manner in which the patterns are formed on the surface of the MFI paint 110 will be described in detail with reference to FIGS. 6a and 6b below.

The predetermined configuration imparted by the high intensity magnetic field remains until the disk 100 coated with the MFI paint 110 is exposed to a magnetic field of sufficient intensity to temporarily overcome the magnetic predisposition of the ferrite flakes 125 within the microspheres 120. When the coated disk 100 is exposed to a magnetic field of sufficient intensity, the ferrite flakes 125 within the microspheres 120 are compelled to align with the lines of flux of the impinging magnetic field. The realignment of the ferrite flakes 125 causes a visible change to occur in the pattern formed on the surface of the MFI paint 110. Thus, the user is able to visually detect the presence of a potentially harmful magnetic field in the vicinity of the magnetic storage device (e.g., the floppy disk 100). If, in a special application, the ferrite flakes 125 have a previously imparted magnetic predisposition, the ferrite flakes 125 resume their previous orientation, when the coated disk is removed from the presence of the magnetic field. This causes the visible pattern on the surface of the MFI paint 110 to assume its original configuration. In other applications, however, where no magnetic predisposition is imparted to the ferrite flakes 125, the pattern produced by the last exposure to a magnetic field remains until the user manually erases the pattern by means of a bar magnet or the like.

In another application of the present invention, a thin coating of the MFI paint 110 can be applied to the surface of sheet stock or paperback material such as a label. FIG. 2 is an assembly view of a floppy disk 200, including a magnetic recording media 204, and the magnetic field indicator embodied as an MFI (Magnetic Field Indicator) label 210. The MFI label 210 may be affixed in a conventional manner to the surface of the floppy disk 200 as shown. In this embodiment, the MFI label 210 may include printed or screen printed information so that the MFI label 210 serves as a conventional label as well as a magnetic field warning indicator. The MFI label 210 is advantageously produced to have a thin, film-like coating wherein an arrangement of ferrite-encapsulating microspheres is suspended. This may be done by simply coating the exposed surface of the MFI label 210 with one or more layers of the MFI paint 110.

The nature of the coating which is applied to the MFI label 210 is typically dependent upon considerations such as the contrast which may be provided between the visual indications of the activated and unactivated states of the MFI label 210. In one embodiment, the MFI coating 110 could consist of an emulsion similar to a standard ferrite-based photographic emulsion which includes the microspheres 120. The emulsion could then be cured using conventional UV light techniques. In order to prevent oxidation, a clear printed coating may then be applied over the emulsion (i.e., the MFI paint 110). In one embodiment, the MFI paint 110 is deposited onto a light absorbing substrate of the MFI label 210, while the ferrite flakes 125 suspended within the coating are reflective. Thus, when the flakes 125 are aligned so that they reflect the incident light, the MFI label 210 appears light, whereas when light is allowed to pass through the coating, the MFI label 210 appears dark.

As with the MFI paint 110 which is applied to the surface of the floppy disk 100, the ferrite flakes 125 within the microspheres 120 suspended within the coating of the MFI label 210 are forced to align with the lines of flux of a magnetic field of sufficient strength when the magnetic field is present near the MFI label 210. The realignment of the ferrite flakes 125 produces a visible change in the surface of the MFI label 210. Various patterns may therefore be produced on the surface of the MFI label 210. These patterns may also be made permanent by means of a high intensity magnetic field as described above with reference to FIG. 1. Thus, the MFI label 210 provides a simple means by which a user is able to visually detect the presence of a potentially harmful magnetic field in the vicinity of the MFI label 210.

In order to determine if a magnetic field is potentially harmful to the magnetic media 204, the intensity of the magnetic field at the exposed portions of the media 204 should be evaluated. Because of this, it has been found that, for best results, the MFI label 210 should be positioned so that it is close to the most sensitive portions of the magnetic media 204, or enlarged in order to cover maximum surface area.

The MFI label 210 can be employed in accordance with a number of useful systems which may be contemplated by one skilled in the art. For example, floppy disks are often used to store and transfer data from one database system to another. However, it is possible that the data on a floppy disk could be damaged if the disk is subjected to a magnetic field of sufficient intensity. In order to prevent the damaged data from being transferred into another system, it is desirable that an operator be aware that the data on the disk could be damaged. In addition, it would be especially beneficial if the receiving database system could automatically be informed that the data on the disk is potentially erroneous. As a means of providing such a system for automatically indicating that the data on a magnetic storage device is damaged, the visible pattern formed on the surface of the MFI label 210 may take the form of a bar code or other standard pattern. The bar code may be read by an appropriate optical device which may, for instance, be installed within a floppy disk drive. The bar code, in its original predetermined configuration, may include prespecified information that may be read by the optical sensor within the disk drive. However, if the disk 200 has been exposed to a potentially harmful magnetic field, the bar code pattern on the surface of the MFI label 210 will be altered so that it is no longer decodable by the optical sensor within the disk drive. This will indicate to the sensor that the data on the disk 200 is potentially erroneous, and the optical sensor can transmit a signal to the database system that will prevent the system from reading the data on the disk 200.

Figure 3A:
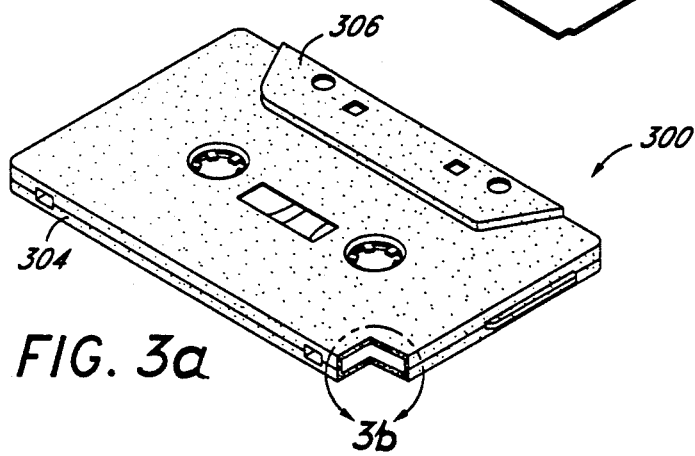
FIG. 3a is a perspective view of an embodiment of the present invention wherein the magnetic field warning indicator is molded in solid form and physically embodied in the external housing of a magnetic medium such as a magnetic storage tape cassette.
Figure 3B:
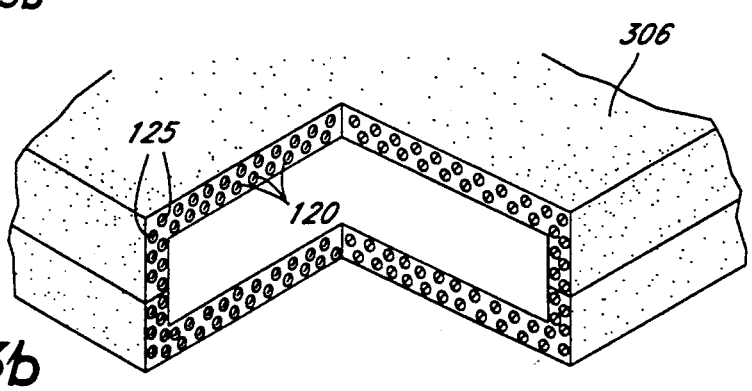

In still another application of the present invention, a magnetic field warning indicator may be provided by incorporating the microspheres 120 within the structure of the housing of the magnetic media itself. This application is particularly advantageous because it provides maximum proximity of the magnetic field indicator to the magnetic media. FIG. 3a is a perspective view which shows a cassette 300 having a magnetic tape media 304 contained within a housing 306. The housing 306 may be constructed of plastic or similar durable material which may be produced by manufacturing means such as injection molding. An enlarged cutaway view of a section of the housing 306 is shown in FIG. 3b. As shown in FIG. 3b, the housing 306 includes within its structure a plurality of the microspheres 120. Thus, the housing 306 may serve as a magnetic field indicator.

The housing 306 may be produced in a manner similar to that used when producing conventional housings, except that a sufficient quantity of the microspheres 120 is added to the material used to form the housing 306. In one application, the material used to form the housing 306 is a thermoplastic such as polyethylene, polycarbonate, or the like, which is durable and which has a relatively low molding temperature, so that the housing 306 may be injection molded. The microspheres 120 are advantageously added to the thermoplastic prior to injection molding, so that, when the housing 306 is formed and cooled, the housing 306 incorporates the microspheres 120 within its structure. A pigment may also be added to the thermoplastic to produce a desired color of the housing 306.

When the housing 306 has been formed to incorporate the microspheres 120, the housing 306 itself acts as a magnetic field warning indicator. That is, the housing 306 will visually indicate the presence of a magnetic field of sufficient intensity which is proximate to the housing 306. As shown in FIG. 3b, the microspheres 120 are incorporated within the structure of the housing 306 so that, when the housing 306 is exposed to a magnetic field of sufficient intensity, the ferrite flakes 125 within the microspheres 120 are forced to align with the lines of flux of the magnetic field. The realignment of the ferrite flakes 125 causes the reflective properties of the surface of the housing 306 to change thereby creating a visible difference between the surface of the housing 306 before and after the introduction of the magnetic field.

As in the previous applications of the invention, it is desirable to provide a high degree of contrast between the activated and unactivated states of the magnetic field indicator as embodied in the housing 306. This contrast may be achieved by selecting the appropriate pigments during the forming process of the housing 306, and/or inscribing a high contrast pattern on the surface of the housing 306. The inscription of a high contrast pattern on the surface of the housing 306 may be achieved by means of a high intensity magnetic field which can be used to impart a permanent or semi-permanent magnetization pattern to the ferrite flakes 125 as described with reference to FIG. 1a.

This implementation of the invention is particularly advantageous in applications where the magnetic media housing 306 is subjected to physically stressful conditions. This is because such conditions could chip or wear through the MFI paint 110 thereby rendering the MFI paint 110 ineffective. In addition, the embodiment wherein the microspheres 120 are incorporated within the structure of a transparent solid material allows an observer to detect and provide a detailed three-dimensional analysis of the lines of magnetic flux generated by a magnetic field within the solid.

In a further application of the invention, the magnetic field indicator may be incorporated within a gel-like substance 400 as shown in FIGS. 4a and 4b. In one application, the gel 400 is sealed within a thin, liquid-proof package 410 which may include an adhesive backing so that the package 410 can be conveniently affixed to the surface of a magnetic storage device such as a floppy disk 420 or other magnetic-sensitive device or equipment. In the packaged form, the gel 400 may be utilized in much the same manner as the label 210.

In the application shown in FIG. 4a, the gel 400 may comprise silicon, for example, or other suitable gel material which is substantially inert and does not suffer deleterious effects due to the presence of a magnetic field. It should be noted that silicon rubber is particularly environmentally inert. Thus, the gel embodiment of the invention is particularly useful in otherwise chemically destructive environments. To provide a magnetic field indicator, a sufficient quantity of the microspheres 120, shown in an enlarged view in FIG. 4b, may be added to the gel 400 prior to packaging.

When an appropriate number of the microspheres 120 has been incorporated within the gel 400, the gel 400 will provide a visual indication of the presence of a magnetic field proximate to the gel 400. As in the case of the MFI paint 110, and the housing 306, the visual indication provided by the gel 400 is due to the realignment of the ferrite flakes 125 within the microspheres 120 in the presence of a magnetic field. The change in the alignment of the ferrite flakes 125 causes observable variations to occur in the reflectivity of the ferrite flakes 125, thereby providing a visual indication of the presence of the magnetic field.

In order to manifest the presence of a magnetic field, a high degree of contrast should be provided between the appearance of the gel 400 when a magnetic field is sensed, and the appearance of the gel 400 when no magnetic field is sensed. The contrast between the two states may be provided in a variety of ways. For example, a dark pigment may be added to the gel 400 so that the gel 400 is extremely light absorbent in the unactivated state, while being highly reflective in the activated state. In addition, selective transmissive, absorptive, and reflective combinations of the backing material, the gel 400, and the ferrite flakes 125 may be employed to maximize contrast between the activated and unactivated states. Thus, the gel 400 provides an effective and inexpensive magnetic field indicator for detecting the presence of a potentially harmful magnetic field proximate to a magnetic medium, particularly in otherwise chemically destructive environments.

A further application of the present invention is illustrated in FIGS. 5a and 5b which show the magnetic field indicator as embodied within the fibers of a woven material such as a cloth 450. The cloth 450 may be made exclusively of one material or the cloth 450 may be made of a blend of two or more materials.

FIG. 5b is an enlarged cross-sectional view of a portion of the cloth 450 which shows the interweaving of fibers 460, 470. As shown, the fibers 460 are woven parallel to the plane of the cross-section, while the fibers 470 are woven so that the fibers 470 are roughly perpendicular to the plane of the cross-section. In the embodiment shown, the fibers 460 are synthetically produced and incorporate the microspheres 120 within their structure. As stated above, the fibers 460, 470 may be fibers of the same material (e.g., nylon, polyester, etc.) or the fibers 460 may be made of a different material than the fibers 470. If the fibers 470 are synthetic, the microspheres 120 may also be incorporated into the structure of the fibers 470, however, if the fibers 470 are natural (e.g., cotton, wool, etc.) the microspheres may only be incorporated within the structure of the fibers 460.

The cloth 450 may be manufactured in a variety of ways which are similar to conventional textile manufacturing processes with the exception that the microspheres 120 are incorporated within the synthetic fibers 460 during the manufacturing process. In a conventional textile manufacturing system, thin fibers are typically interwoven on a large loom, or by means of a needle punch process. The fibers may be composed of natural materials, or the fibers may be produced synthetically by means of an extruding process or the like. In some systems, a synthetic substance may be reduced to liquid form and extruded through fine apertures. The extruded material is then quickly cooled (e.g., by means of cold water), so that the substance reassumes a solid state and becomes a fiber. In such systems, the microspheres could be added to the synthetic substance while it is in the liquid state, so that the cooled strands of the substance actually incorporate the microspheres 120 within their structure. In the case of natural fibers, it is possible to add the microspheres 120 to the fibers during the weaving process in which the short strands of the natural fibers are spun into longer fibers. Thus, it is possible to include the microspheres 120 in both natural and synthetic fibers of the cloth 450.

Once the microspheres 120 have been included within the cloth 450, the cloth 450 will provide a visual indication of the presence of a sufficiently intense magnetic field in the manner described above. The cloth embodiment, moreover, provides certain advantages since the cloth 450 is flexible and may be shaped to conform to a variety of different contours. For example, the cloth 450 may be used to produce clothing or other products normally manufactured with textile materials. Thus, the cloth embodiment of the present invention provides a wide range of uses not provided by other magnetically sensitive devices.

Figure 6A:
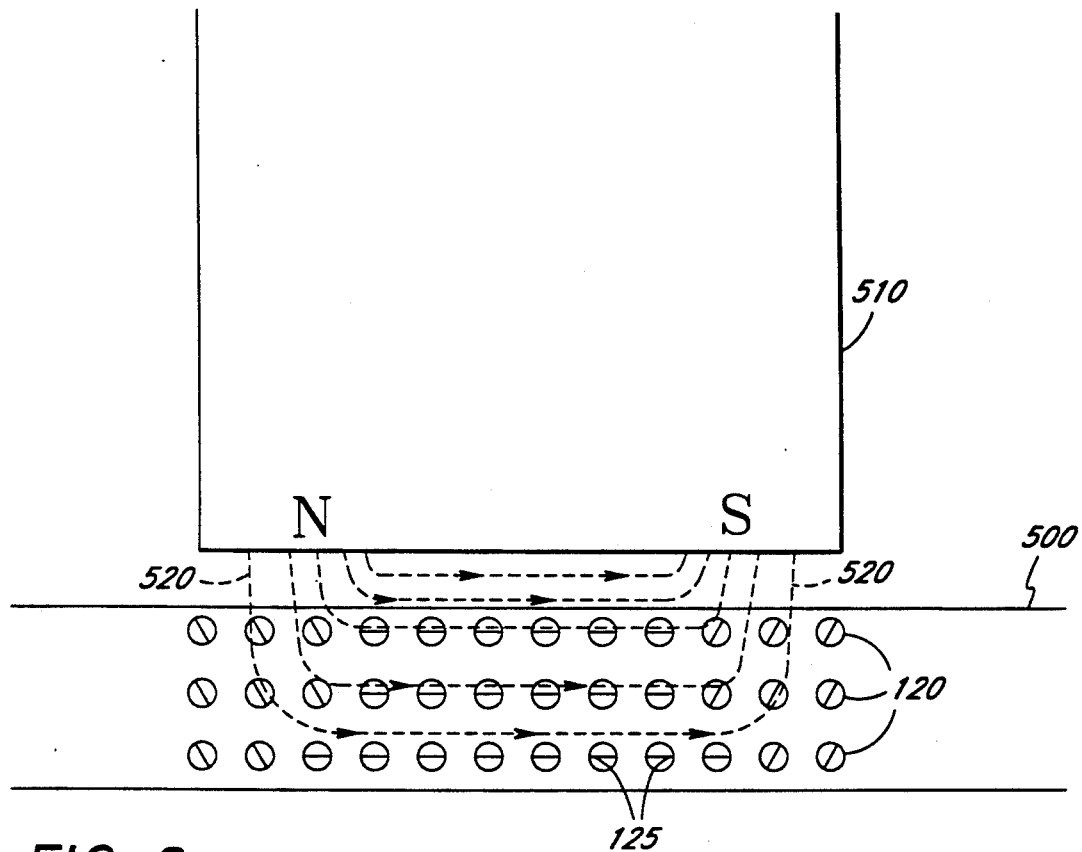
FIGS. 6a and 6b illustrate how a the ferrite flakes within the microspheres can be oriented to form a visual pattern on the surface of a substrate.

As stated above, in accordance with one aspect of the invention, a magnetization pattern may be imparted to the ferrite flakes 125 within the microspheres 120 so that a fixed pattern is visible when the magnetic field indicator is in an unactivated state. FIG. 6a is a schematic illustration which shows how a fixed visible pattern may be inscribed at the surface of a magnetic field indicator 500 constructed in accordance with the present invention.

As shown in FIG. 6a, a magnetic field indicator 500 (e.g., the MFI paint 110, the housing 306, etc.) is positioned adjacent to a magnetic device 510 having multiple poles. The magnetic device 510 may, for example, be a bar magnet, an electro-magnet, or some other source of magnetic energy. The magnetic device 510 generates a high intensity magnetic field which is represented schematically by lines of flux 520. The high intensity magnetic field impinges upon the surface of the magnetic field indicator 500, so that the lines of flux 520 permeate the surface of the indicator 500.

Figure 6B:
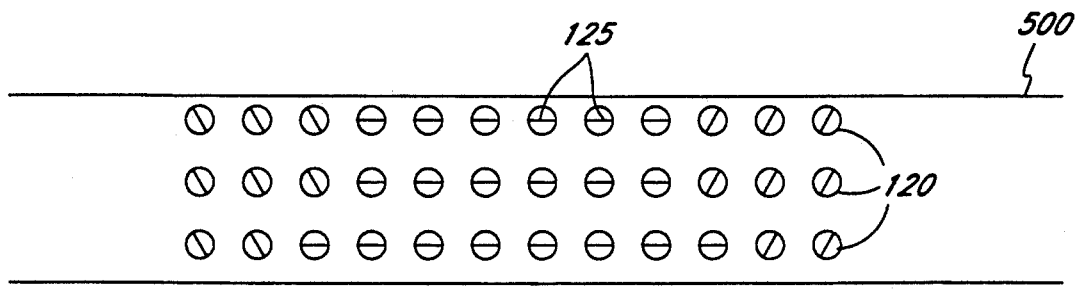

The indicator 500 includes a plurality of the microspheres 120 which encapsulate the ferrite flakes 125. The ferrite flakes 125 react to the presence of the high intensity magnetic field by aligning themselves with the lines of flux 520 as shown. If the high intensity magnetic field is sufficiently intense, the ferrite flakes 125 will themselves be magnetized so that the ferrite flakes 125 will have a tendency to remain in the same alignment, even after the magnetic field is no longer present. Thus, the high intensity magnetic field effectively imparts a magnetic predisposition, and thereby a predisposed physical orientation, to the ferrite flakes 125. In the usual case, however, the ferrite flakes 125 are caused to align with the lines of flux of the high intensity magnetic field, and maintain their same positions due to the lack of sufficient energy to overcome the resistance due to the viscosity of the suspension material. The orientations of the ferrite flakes 125 after the withdrawal of the high intensity magnetic field is shown in FIG. 6b. As shown, the ferrite flakes 125 retain the orientation which they assumed in the presence of the high intensity magnetic field even after the high intensity field has been withdrawn.

Figure 7A:
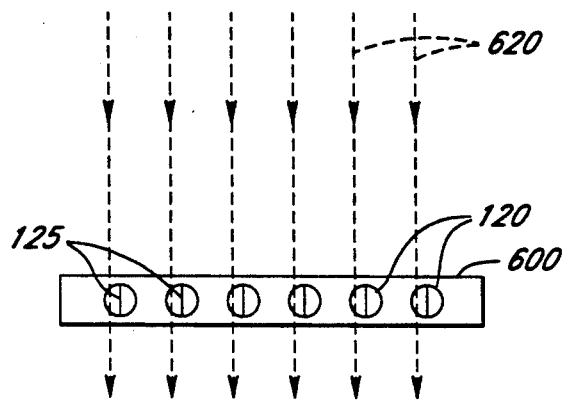
FIGS. 7a and 7b are cross-sectional views showing a single layer of ferrous material encapsulated within microspheres in a first light transmissive orientation (FIG. 7a) and a second light reflecting orientation (FIG. 7b).
Figure 7B:
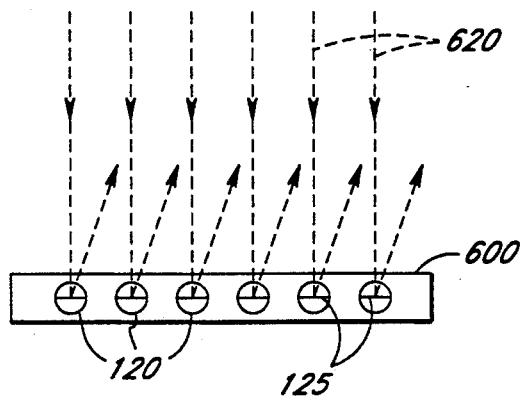

The orientation of the ferrite flakes 125 corresponds to a visible pattern on the surface of the indicator 500. The reason for this is illustrated with reference to FIGS. 7a and 7b. In FIGS. 7a and 7b, a plurality of the microspheres 120 which encapsulate the ferrite flakes 125 are suspended within a transparent or semi-transparent substrate 600. Light impinging upon the substrate 600 is represented by rays 620 in FIGS. 7a and 7b. In FIG. 7a, the ferrite flakes 125 are aligned so that they are parallel to the rays 620 of the incident light. Because the substrate 600 is transparent, the majority of the light rays 620 are allowed to pass through the substrate 600. These light rays 620 are not reflected by the ferrite flakes 125 since the flakes 125 are aligned parallel to the direction of the impinging rays 620. Thus, very little light is reflected from the surface of the substrate 600. In FIG. 7b, the ferrite flakes 125 are aligned so that they are roughly perpendicular to the rays 620 of the impinging light. As shown, the rays 620 enter the substrate and are reflected by the ferrite flakes 125. The amount of light which is reflected from the surface of the substrate is dependent upon the angle of incidence of the impinging rays 620 as well as the angle of alignment of the ferrite flakes 125. In particular, if the downward direction of the rays 620 is defined to be at an inclination of 0°, the amount of reflected light increases as the alignment of the ferrite flakes 125 relative to the angle of incidence of the impinging light rays 620 approaches 90° (i.e., when the ferrite flakes 125 are aligned so that their surfaces are substantially perpendicular to the impinging light rays 620). The intensity of the reflected light rays 620 is therefore dependent upon the alignment of the ferrite flakes 125. Thus, by varying the alignment of the ferrite flakes 125, the amount of light reflected from the surface of the substrate 600 can be varied.

If the alignment of the ferrite flakes 125 is varied over the surface of the substrate 600 so that different portions of the substrate 600 suspend ferrite flakes 125 having differing angular orientations, then the corresponding variations in the intensity of the reflected light over the surface of the substrate 600 will create a visible pattern on the substrate surface. This visible pattern may, for example, consist of regions of contrasting light and dark where the ferrite flakes 125 are aligned perpendicular and parallel respectively to the direction of the impinging light.

Returning again to FIG. 6b, the ferrite flakes 125 tend to have varying orientations over the surface of the magnetic field indicator 500 which correspond to the configuration of the lines of flux of the high intensity magnetic field. This means that, when parallel rays of light impinge upon the surface of the indicator 500, a varying pattern will be observed on the surface of the indicator 500. In one embodiment, the magnetic device 510 may be passed over selected portions of the surface of the indicator 500 so that the selected portions are inscribed with a pattern corresponding to the orientations of the ferrite flakes 125. For example, in the configuration shown in FIGS. 6a and 6b, the magnetic device 510 might inscribe a pattern of contrasting straight or wavy lines along the surface of the indicator 500. This pattern will remain while the ferrite flakes 125 retain their orientation. If, however, a sufficiently intense magnetic field is introduced proximate to the indicator 500, then the ferrite flakes 125 will align themselves, at least temporarily, with the lines of flux of the new field. This will result in a change in the pattern displayed on the surface of the indicator 500 so that a user is informed of the presence of a magnetic field. Once the magnetic field has been withdrawn, the flakes 125 may be realigned to their original orientations by means of a magnetic field having a configuration similar to the field configuration of the high intensity magnetic field produced by the magnetic device 510. Furthermore, it has been found that a preliminary static orientation of the ferrite flakes 125 in one direction aids subsequent reorientation. That is, the preliminary reorientation of the flakes 125 acts to create a "blank slate" so that a pattern which is subsequently written onto the indicator 500 will be more clearly visible.

Thus, in one embodiment of the present invention, a high contrast pattern may be permanently inscribed within a magnetic field indicator device (e.g., the MFI paint, the housing 306, etc.) so as to manifest the distinction between the activated and unactivated states of the magnetic field indicator device.

Figure 8:
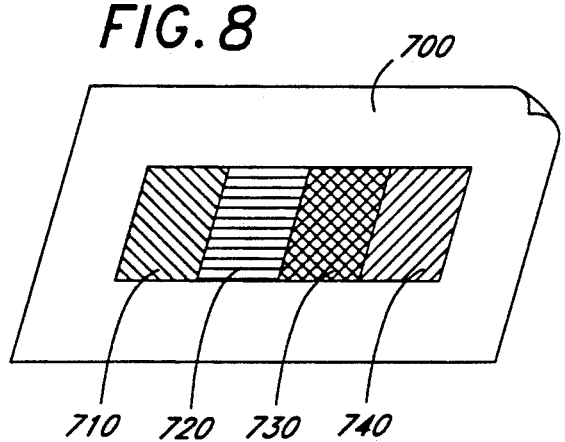
FIG. 8 illustrates the magnetic field warning indicator as embodied in a label wherein the sensitivity of the indicator is varied along the surface of the label so that the magnetic field indicator may provide an indication of the intensity of the magnetic field.

The magnetic field indicator of the present invention also provides a means for visually evaluating the intensity of a magnetic field proximate to the magnetic field indicator. FIG. 8 is a perspective view of an MFI intensity evaluator 700. The evaluator 700 may, for example, be embodied in accordance with any of the aforementioned applications of the invention. In one embodiment, the evaluator includes a plurality of different strips 710-740 wherein each strip comprises a different type of MFI paint 110. The paints used to produce the strips 710-740 differ in that each paint 110 is saturated with microspheres 120 wherein the encapsulated ferrite flakes 125 have differing resistances to being realigned. That is, in the presence of a magnetic field, the ferrite flakes 125 encapsulated within one type of microsphere 120 are less apt to align themselves with the lines of flux of a magnetic field than the ferrite flakes 125 within another type of microsphere 120. In one embodiment, this is because the viscosity of the suspension fluid which supports the ferrite flakes 125 within the microspheres 120 is different for different types of microspheres 120. Thus, those types of microspheres 120 which contain fluids of a higher viscosity have ferrite flakes 125 which are more resistant to realignment, and are therefore less sensitive to the presence of a magnetic field. Each of the different strips 710-740 of MFI paint 110 shown in FIG. 8 is therefore more or less sensitive to the presence of a magnetic field. If the strips 710-740 are positioned so that they are in order from most sensitive to least sensitive (e.g., 710 being most sensitive, and 740 being least sensitive), then a magnetic field intensity evaluation scale is provided which allows a user to gauge the intensity of a magnetic field.

For example, the MFI paint 110 in the strip 710 may be produced so that it is twice as sensitive to the presence of a magnetic field as the MFI paint 110 in adjacent strip 720. That is, the strip 710 provides a noticeable visual indication of the presence of a magnetic field having a given intensity at a given distance, while the adjacent strip 720 provides a similar visual indication when a magnetic field having twice the intensity at the same distance is present. In addition, if the lowest intensity at which a magnetic field produces a visual indication is known for a particular strip, a quantitative estimation of the intensity of the magnetic field can be made. For example, if the lowest magnetic field intensity which activates a visual indication on the surface of the strip 710 is 50 oersteds, and each of the successive strips 720-740 is half as sensitive as the adjacent strip to its left (i.e., the strip 720 will activate at 100 oersteds, the strip 730 will activate at 200 oersteds, and the strip 740 will activate at 400 oersteds), then a user will be able to approximate the intensity of a magnetic field adjacent to the evaluator 700 simply by observing which strips activate. For instance, if the strips 710, 720 activate, while the strips 730, 740 do not activate a user will know that the intensity of the magnetic field is between 100 and 200 oersteds. Of course, more strips may be added, and the sensitivity increments between strips decreased to provide a more accurate means for evaluating the intensity of a magnetic field by means of the evaluator 700. The evaluator 700 may be embodied in a number of different variations (e.g., as a bar graph, a continuous scale, etc.) depending upon the desired application. Thus, the present invention also provides a simple, reliable, and cost effective means for evaluating the intensity of a magnetic field proximate to a magnetic data storage device, or, such as may be desired by those concerned about electromagnetic fields generated by power transmission lines.

The teachings of the present invention, in addition to being applied in devices which serve as a magnetic field warning indicator, may also be applied to other embodiments which may be used to provide a means for visually displaying signs and symbols, or which may be used to create electro-magnetically controllable shutters, polarizing windows and the like.

FIGS. 9a-9f illustrate a variety of embodiments of the invention which may be used to provide a display window, or electro-magnetically controllable shutters and polarizing windows. In the embodiment of the invention shown in FIGS. 9a-9c, a pane 800 includes a plurality of etched inductor coils 802 and trace paths 804. Although shown here in exaggerated size, the coils 802 and trace paths 804 are advantageously minute so that they are not readily visible to the naked eye. The pane 800 may be made of a variety of materials. For example, in one embodiment, the pane 800 may be made of transparent acrylic having a plurality of the microspheres 120 incorporated within the structure of the acrylic. The microspheres 120, although not shown here, are substantially the same as those shown in FIG. 3. The microspheres 120 may be incorporated into the pane 800 in much the same manner as the microspheres 120 are incorporated within the housing 306, as described with reference to FIG. 3. In another embodiment, the microspheres 120 may be included in a transparent coating which is applied to the surface of the pane 800.

Figure 9A:
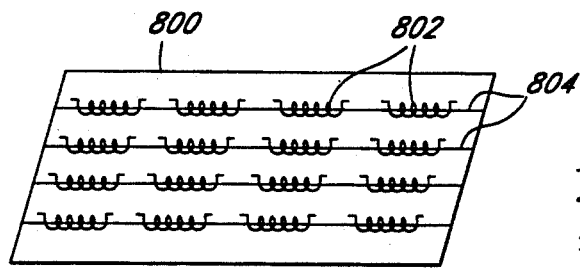
Figure 9B:
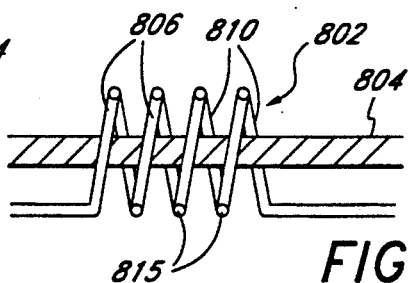
Figure 9C:
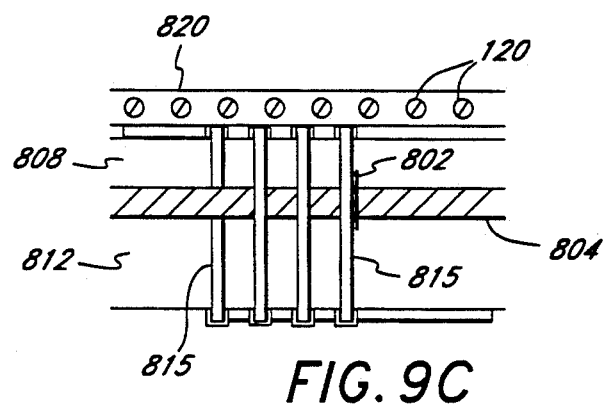

The coils 802 and the conductive trace paths 804 may be manufactured in a variety of ways. For example, the coils 802 and the trace paths 804 may be etched into the pane 800 in a manner similar to that used for printed circuit board etching. FIGS. 9b and 9c are enlarged top and side views respectively of one of the coils 802 as etched into the pane 800. The coil 802 comprises a series of parallel traces 806 which are etched into a top layer 808 above the trace 804, and a series of diagonal traces 810 which are etched into a bottom layer 812 below the trace 804. A plurality of vertical connecting conductors 815 extend through the top and bottom layers 808, 812, and electrically connect the traces 806 to the traces 810. As shown in FIG. 9b, a surface coating 820, containing the microspheres 120 may be applied to the surface of the top layer 808.

When a sufficient electrical current is caused to flow through the coils 802, a magnetic field is induced proximate to the coils 802 which is capable of realigning the ferrite flakes 125 within the microspheres 120. Depending upon the direction of the flow of current through the coils 802, the region proximate to each coil 802 may be made light or dark in accordance with the alignment of the ferrite flakes 125. When the coils 802 are located proximate to one another in a grip like pattern, each of the regions upon the surface of the pane 800 can be caused to behave effectively like a pixel in a liquid crystal display screen. That is, each region may be made selectively light or dark so that a grid of light or dark areas capable of providing a desired pattern is formed. In this case, designs, symbols, or signs may be formed by the alternating reflective and absorptive (i.e., light and dark) regions on the pane 800. If the layers of the pane 800 are transparent, then this grip of coils 802 may be used to form opaque regions of the pane 800 so that light is prevented from passing through these regions of the pane 800. Thus, this application of the present invention may be used to provide a means for visually displaying signs and symbols, or which may be used to create electro-magnetically controllable shutters, polarizing windows and the like.

Figure 9D:
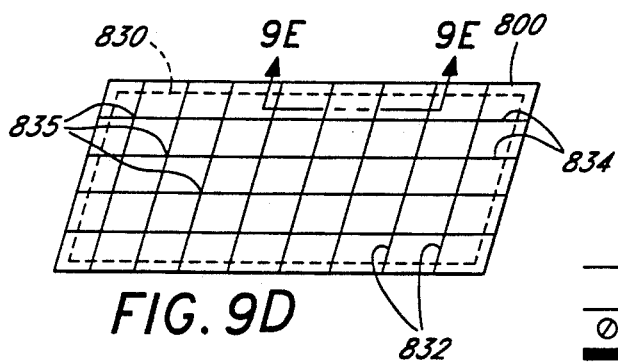
Figure 9E:
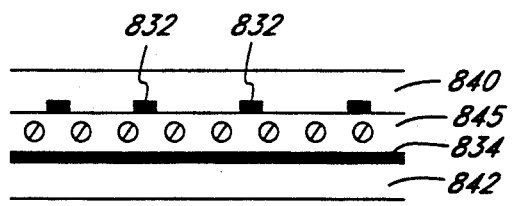
Figure 9F:
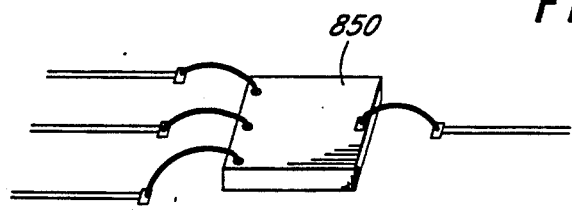

Another adaptation of the invention is shown in FIGS. 9d and 9e. In this adaptation, a conductor matrix 830 (generally contained within the dashed lines) is formed on the pane 800. As shown in FIG. 9d, the conductor matrix 830 is made up of a plurality of vertical and horizontal electrically conductive traces 832, 834 which cross at a plurality of matrix junctions 835. The conductor matrix 830 may advantageously be made of very fine conductors so that the conductor matrix 830 does not significantly detract from the transparency of the pane 800.

A cross-sectional side view of the pane 800 along the line 8e—8e is shown in FIG. 9e. As shown in FIG. 9e, the pane 800 may comprise three layers. A top layer 840 contains the contains the vertical traces 832, while a bottom layer 842 contains one of the horizontal traces 834. A middle layer 845 is situated between the top and bottom layers 840, 842 and contains a plurality of the microspheres 120. In one embodiment, the traces 832, 834 of the conductor matrix 830 are etched into the pane 800 by a process similar to that employed in conventional circuit board manufacture.

In this embodiment, the conductor matrix 830 may be used to activate regions of the pane 800 so that these activated regions become light or dark. This is advantageously accomplished by causing current to flow along selected ones of the vertical and horizontal traces 832, 834. As current flows through the traces 832, 834, a magnetic field is established about the trace, however, this magnetic field is typically weak and, if the appropriate viscosity of the suspension material within the microspheres 120 is selected, unable to effect a change in alignment of the ferrite flakes 125. At the junction 835, however, the components of the magnetic fields about a vertical trace 832, and a horizontal trace 834 add in such a way as to increase the overall intensity of the magnetic field between the vertical and horizontal trace 832, 834. If this total intensity is sufficient, the ferrite flakes 125 are caused to realign with the lines of flux of the magnetic field between the two traces.

It has been found that the lines of the magnetic flux between the traces 832, 834 can be made opposite in direction if the current flowing through each of the traces 832, 834 is made opposite in direction. Thus, the ferrite flakes 125 may be caused to align in opposite orientations depending upon the direction of the flow of current in each of the traces 832, 834. Thus, a region of the pane 800 proximate to a junction 835 may be made selectively light or dark by causing current to flow in the appropriate directions through its component vertical and horizontal traces. Therefore, as with the embodiment described with reference to FIGS. 9a-9c, a grid of pixel-like regions is formed on the surface of the pane 800 which may be used to provide a variety of symbols, or patterns, or which may be used to provide electronic shutters of polarizing windows.

It should be noted that the pane 800 need not be constructed of transparent material which incorporates the microspheres 120. In an alternative embodiment, for example, the pane 800 could be made of an opaque material which has a conductor matrix etched onto its surface. This pane could then be coated with the MFI paint 110. The conductor matrix could then be used to affect the visual characteristics of the surface of the MFI paint 110 as described above.

In yet another application of the present invention, a plurality of sub-miniaturized chips 850, which are capable of producing a magnetic field having a desired configuration and a substantial intensity, may be wire bonded to conductive traces on the surface of a substrate. The substrate may be coated with a material containing the microspheres 120, and the chips 850 may be arranged in a grid or other ordered pattern so that each chip 850 may be selectively activated to affect the visual characteristics of regions on the surface of the substrate. Thus, desired patterns of light, dark, or opaque regions may be formed on the surface of the substrate.

Figure 10A:
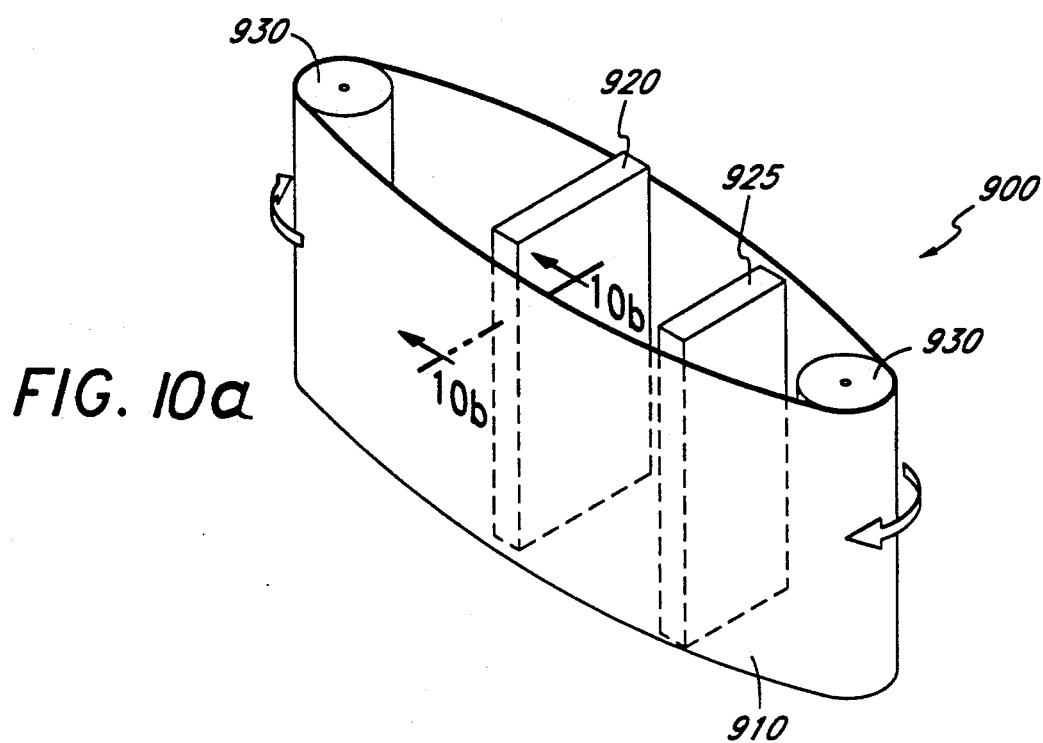
FIGS. 10a and 10b show an embodiment of the invention wherein a magnetic write head can be employed to form a visual pattern on the surface of a sheet.
Figure 10B:
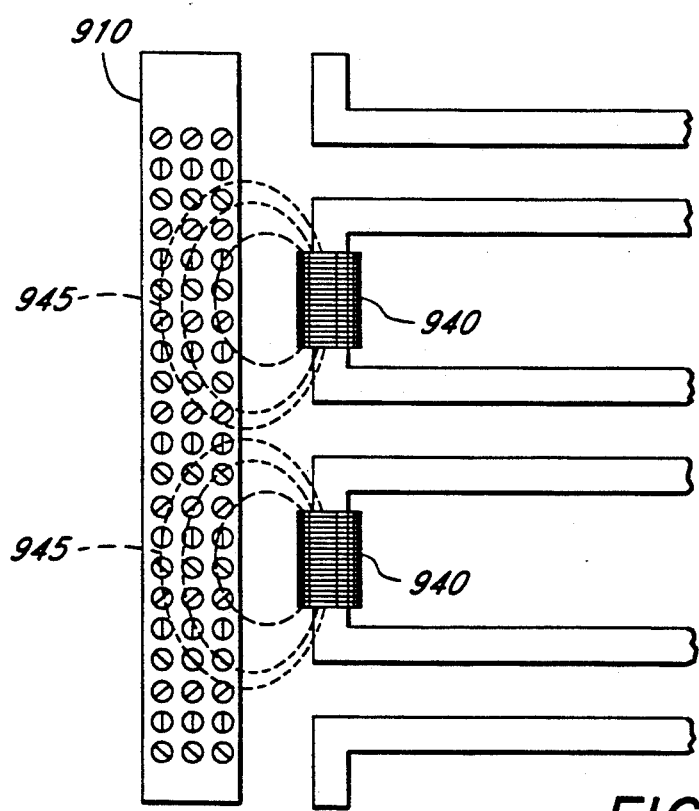

FIGS. 10a and 10b illustrate a further application of the invention which may be employed to provide a magnetically controllable visual display device. As shown in FIG. 10a, a display device 900 comprising an endless loop sheet 910 and a multiple head magnetic write bar 920. The sheet 910 is attached to a pair of cylinders 930 which are rotatably mounted so that the sheet 910 is able to scroll past the magnetic write bar 920. A permanent magnet "wiper" bar 925, which acts to pre-orient the ferrite flakes in one direction, is also includes in the device 900 as well. In one embodiment, the sheet 910 is made of a thin plastic material which incorporates the microspheres 120 within its structure. In another embodiment, the sheet 910 may consist of a magnetically responsive cloth such as that described with reference to FIG. 5. The magnetic write bar 920 is capable of producing a magnetic field so that, when the sheet 910 scrolls horizontally past the magnetic write bar, a visible display is created on the sheet 910. The bar 925 acts to orient the ferrite flakes prior to writing so that a higher contrast between the written pattern and the background of the sheet 910 may be achieved.

FIG. 10b is a cross-sectional view of a portion of the magnetic write bar 920, and the sheet 910, along the line 9b—9b. A plurality of microspheres 120 are shown within the sheet 910. The sheet 910 is proximate to a number of coils 940 which may be used to generate magnetic fields. These magnetic fields are represented in FIG. 10b by lines of flux 945. It should be noted that, although the coils 940 are used to generate the magnetic fields shown here, a number of devices, such as conventional two pole magnetic write heads, may be used to produce the desired magnetic fields. In addition, etched coils, such as those shown in FIGS. 9a-9c may also be used in accordance with this aspect of the invention.

The magnetic fields cause the ferrite flakes 125 within the microspheres 120 to realign along the lines of flux 945. This causes a visible contrast to occur between these regions of the sheet 910 which contain the realigned ferrite flakes 125, and those which do not. The viscosity of the suspension material within the microspheres 120 should be sufficient viscosity, so that the flakes 125 retain their orientation for a desired duration. Thus, as the sheet 910 scrolls horizontally past the magnetic write bar 920, including the individual write coils 940, a plurality of high contrast regions (e.g., dots) are created along the surface of the sheet 910 past the magnetic write bar 920. This region is accordingly called the display area.

When the write coils 940 are activated at the appropriately selected intervals, the high contrast regions formed on the surface of the sheet 910 may be arranged so that they form letters, symbols, or the like. Thus, the magnetic write bar 920 may be used in a manner similar to that employed in conventional dot matrix printers, wherein a matrix of dots is used to form letters or figures on sheets of paper.

The aspect of the invention illustrated in FIGS. 10a and 10b, need not be limited to the mechanism shown. For example, the magnetic write bar 920 may be used to write visual data onto a credit card embodied in accordance with the invention as shown in FIG. 1d. Similarly, a variety of devices may be constructed to provide appropriate magnetic fields for displaying data on surfaces of objects such as those described herein.

As manifested by the foregoing descriptions, the magnetic field indicator of the present invention may be implemented in a variety of applications which are in no way limited to the applications described above. For example, the magnetic field indicator may be embodied within the fibers of a textile. In addition, it is possible that one skilled in the art would conceive of alternative methods of providing a visual indication of the presence of a magnetic field. For example, the microspheres 120 containing the ferrite flakes 125 could instead be embodied as tiny capsules which contain a solution that becomes opaque (or, alternately, transparent) in the presence of a magnetic field. Also, any material which changes it's response to light when impinged upon by a magnetic field, such as a noematic polymer, or a stereochemic isomerism may be used in accordance with the teachings and applications of the present invention. Accordingly, the foregoing description should be construed as illustrative and not restrictive. The scope of the invention should therefore be interpreted in light of the appended claims and any equivalents thereof which fall within the spirit of the claimed invention.

We claim:

1. A magnetic storage device for recording and storing electronic data, said device being adapted to detect the presence of an external magnetic field which could destroy some or all of the electronic data stored on said device, said device comprising:
    magnetic recording media for recording and storing electronic data;
    a housing for receiving said media, said housing having at least one substantially planar surface; and
    a magnetic field indicator having a substantially thin, planar configuration and adapted to be mounted on said planar surface of said housing so as to closely conform to said surface, whereby the overall configuration of said magnetic storage device is not altered, said indicator comprising:
    a substrate having a lower surface and an upper surface, said lower surface having an adhesive formed thereon for mounting said indicator on said housing; and
    a layer of magnetic sensitive material applied to said substrate, said material comprising microencapsulated flakes responsive to an external magnetic field, said flakes having a first orientation in the absence of said external magnetic field but at least some of said flakes assuming a second orientation in the presence of said external magnetic field, said flakes in said second orientation being light-reactive so as to provide an immediate visual indication of the presence of said field,
    said flakes having a gradually varying rate of responsiveness to said external magnetic field, whereby some of said flakes are responsive to a field of one strength but other flakes are responsive only to a field of a higher strength, whereby a visual indication of the strength of said field is provided,
    the color of said upper surface of said substrate providing a contrast for the light reaction of said flakes when in said second orientation, whereby said visual indication of said field is enhanced.

2. The magnetic storage device of claim 1, wherein said microencapsulated flakes in said first orientation are variably oriented whereby a visual pattern is formed by said flakes to provide a greater visual contrast when said flakes are in said second orientation.

3. The magnetic storage device of claim 1, wherein said flakes are variably responsive to said external magnetic field whereby some of said flakes are responsive to a field of one strength but other flakes are responsive only to a field of a higher strength, whereby a visual indication of the strength of said field is provided.

4. The magnetic storage device of claim 1, wherein said flakes of variable responsiveness are arranged sequentially from highest responsiveness to lowest responsiveness, whereby a graduated scale for indicating the strength of said field is provided.

5. The magnetic storage device of claim 1, wherein said flakes have a magnetic pre-disposition such that upon removal of said external magnetic field said flakes return to said first orientation.

6. The magnetic storage device of claim 1, wherein said indicator comprises a label having a self-adhesive backing for mounting said label on said housing.

7. The magnetic storage device of claim 1, wherein said layer of magnetic-sensitive material comprises a coat of paint in which said microencapsulated flakes are suspended.

8. The magnetic storage device of claim 1, wherein said indicator comprises a coat of paint covering substantially the entire surface of said housing.

9. The magnetic storage device of claim 1, wherein said indicator is formed integrally with said housing.

10. A magnetic storage device for recording and storing electronic data, said device being adapted to detect the presence of an external magnetic field which could destroy some or all of the electronic data stored on said device, said device comprising:
    magnetic recording media for recording and storing electronic data;
    a housing for receiving said media, said housing having at least one substantially planar surface; and
    a magnetic field indicator having a substantially thin, planar configuration and adapted to be mounted on said planar surface of said housing so as to closely conform to said surface, whereby the overall configuration of said magnetic storage device is not altered, said indicator comprising:
- a substrate having a lower surface and an upper surface, said lower surface having an adhesive formed thereon for mounting said indicator on said housing; and
- a layer of magnetic sensitive material applied to said substrate, said material comprising microencapsulated flakes responsive to an external magnetic field, said flakes having a first orientation in the absence of said external magnetic field but at least some of said flakes assuming a second orientation in the presence of said external magnetic field, said flakes in said second orientation being light-reactive so as to provide an immediate visual indication of the presence of said field, the color of said upper surface of said substrate providing a contrast for the light reaction of said flakes when in said second orientation, whereby said visual indication of said field is enhanced.

* * * * *